US012027605B2

(12) United States Patent
Yang et al.

(10) Patent No.: US 12,027,605 B2
(45) Date of Patent: Jul. 2, 2024

(54) FIELD EFFECT TRANSISTORS WITH NEGATIVE CAPACITANCE LAYERS

(71) Applicant: Taiwan Semiconductor Manufacturing Co., Ltd., Hsinchu (TW)

(72) Inventors: Chansyun David Yang, Shinchu (TW); Chan-Lon Yang, Taipei (TW); Keh-Jeng Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/362,281

(22) Filed: Jul. 31, 2023

(65) Prior Publication Data

US 2023/0378317 A1    Nov. 23, 2023

Related U.S. Application Data

(63) Continuation of application No. 17/815,033, filed on Jul. 26, 2022, now Pat. No. 11,769,818, which is a continuation of application No. 16/925,718, filed on Jul. 10, 2020, now Pat. No. 11,437,371.

(51) Int. Cl.
*H01L 29/06* (2006.01)
*H01L 29/423* (2006.01)
*H01L 29/51* (2006.01)
*H01L 29/66* (2006.01)
(Continued)

(52) U.S. Cl.
CPC ...... *H01L 29/6653* (2013.01); *H01L 29/0673* (2013.01); *H01L 29/42392* (2013.01); *H01L 29/513* (2013.01); *H01L 29/66787* (2013.01); *H01L 29/6681* (2013.01);
(Continued)

(58) Field of Classification Search
CPC .......... H01L 29/0673; H01L 29/42392; H01L 29/66787; H01L 29/78696
See application file for complete search history.

(56) References Cited

U.S. PATENT DOCUMENTS 9,093,530 B2   7/2015   Huang et al.
9,171,929 B2   10/2015  Lee et al.
9,214,555 B2   12/2015  Oxland et al.
(Continued)

FOREIGN PATENT DOCUMENTS

CN    109904236 A    6/2019

OTHER PUBLICATIONS

European Search Report directed to related European Application No. 21184753.8, dated Oct. 25, 2021; 11 pages.

*Primary Examiner* — Robert G Bachner
*Assistant Examiner* — Molly K Reida
(74) *Attorney, Agent, or Firm* — Sterne, Kessler, Goldstein & Fox P.L.L.C.

(57) ABSTRACT

The present disclosure describes a method includes forming a fin structure including a fin base portion and a stacked fin portion on a substrate. The stacked fin portion includes a first semiconductor layer on the fin base portion, a second semiconductor layer above the first semiconductor layer, and a sacrificial semiconductor layer between the first and second semiconductor layers. The method further includes replacing the sacrificial semiconductor layer with a negative capacitance (NC) layer and forming gate electrodes around the NC layer, the first semiconductor layer, and the second semiconductor layer. The NC layer includes an NC dielectric material.

20 Claims, 12 Drawing Sheets

(51) Int. Cl.
*H01L 29/78* (2006.01)
*H01L 21/822* (2006.01)

(52) U.S. Cl.
CPC ...... *H01L 29/7853* (2013.01); *H01L 21/8221* (2013.01); *H01L 29/516* (2013.01)

(56) References Cited

U.S. PATENT DOCUMENTS

| | | |
|---|---|---|
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 11,437,731 B2 | 9/2022 | Yang et al. |
| 2019/0157414 A1 | 5/2019 | Ando et al. |
| 2020/0013870 A1 | 1/2020 | Ha et al. |
| 2020/0013898 A1 | 1/2020 | Yim et al. |
| 2020/0013899 A1 | 1/2020 | Kim et al. |

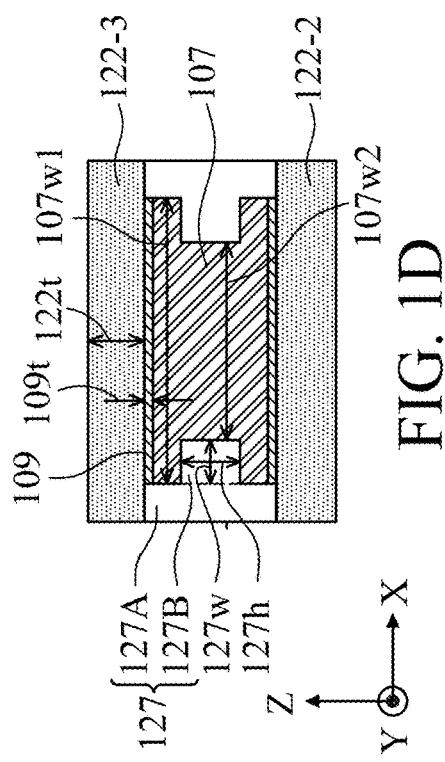
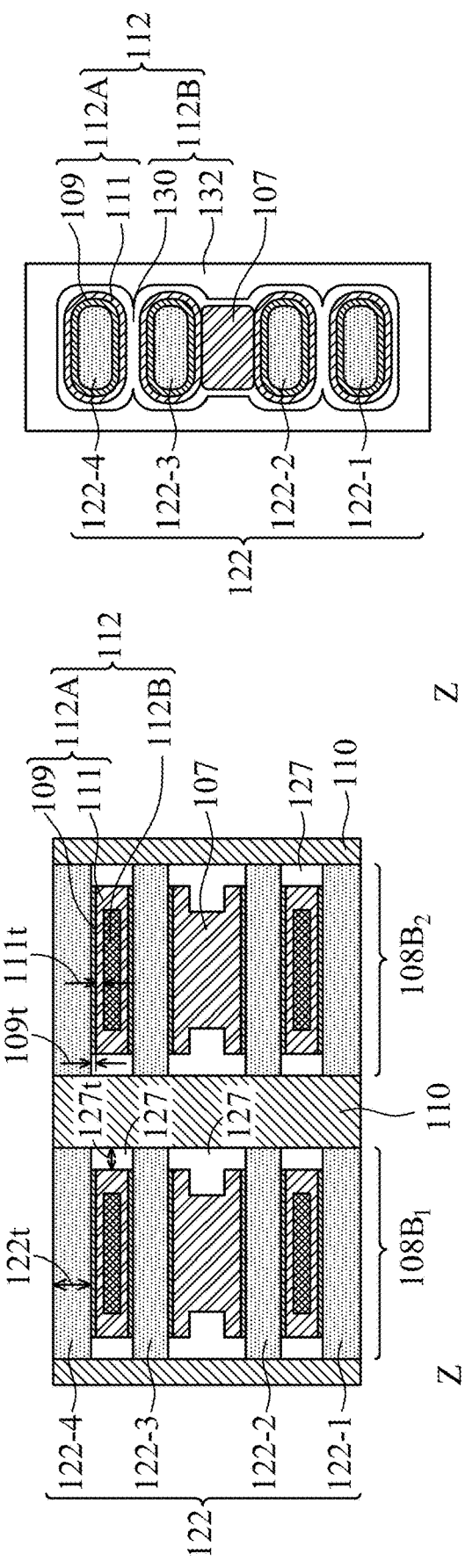
FIG. 1D
FIG. 1C
FIG. 1E

FIELD EFFECT TRANSISTORS WITH NEGATIVE CAPACITANCE LAYERS

CROSS-REFERENCE TO RELATED APPLICATION

This application is a continuation of U.S. Non-Provisional patent application Ser. No. 17/815,033, filed on Jul. 26, 2022, titled "Field Effect Transistors with Negative Capacitance Layers," which is a continuation of U.S. Non-Provisional patent application Ser. No. 16/925,718, filed on Jul. 10, 2020, titled "Field Effect Transistors with Negative Capacitance Layers," and issued as U.S. Pat. No. 11,437,371, which are incorporated by reference herein in their entireties.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of the present disclosure are best understood from the following detailed description when read with the accompanying figures.

FIGS. 1A and 1B-1E illustrate an isometric view and partial cross-sectional views of a semiconductor device with a negative capacitance (NC) layer, respectively, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1B:
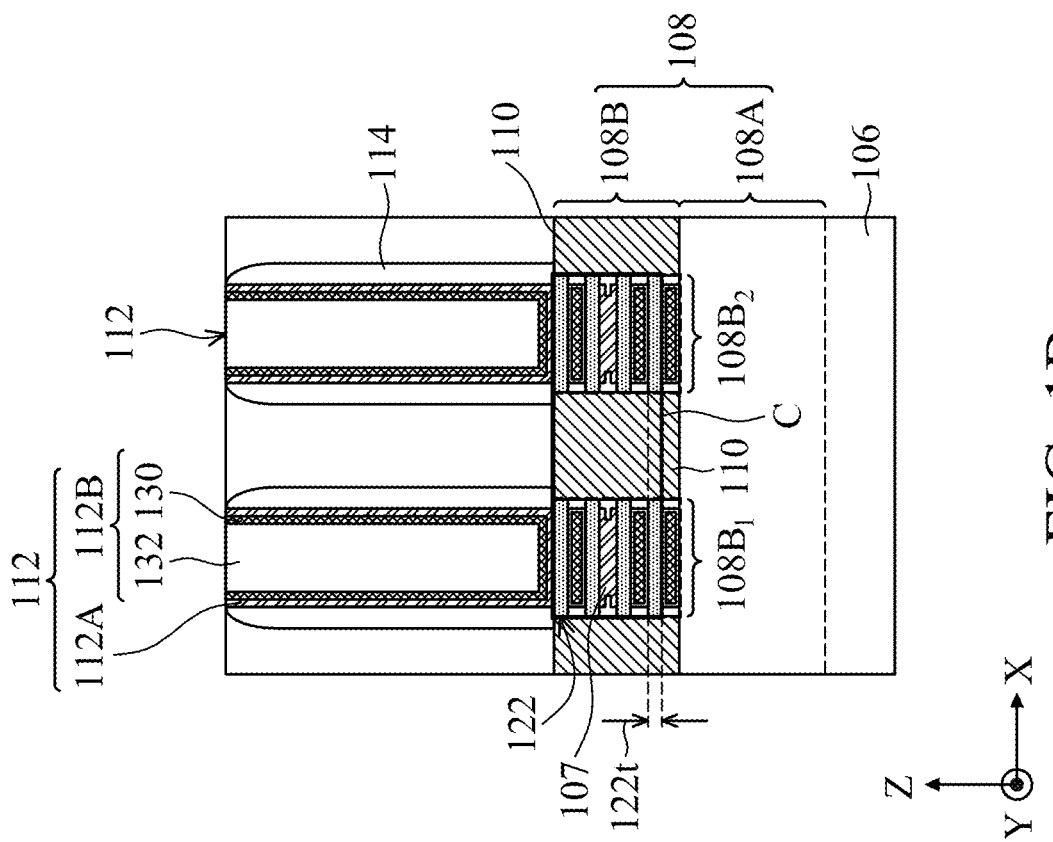

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

As used herein, the term "etch selectivity" refers to the ratio of the etch rates of two different materials under the same etching conditions.

As used herein, the term "substrate" describes a material onto which subsequent material layers are added. The substrate itself may be patterned. Materials added on top of the substrate may be patterned or may remain unpatterned. Furthermore, the substrate may be a wide array of semiconductor materials, such as silicon, germanium, gallium arsenide, indium phosphide, etc. Alternatively, the substrate may be made from an electrically non-conductive material, such as glass and sapphire wafer.

As used herein, the term "high-k" refers to a high dielectric constant. In the field of semiconductor device structures and manufacturing processes, high-k refers to a dielectric constant that is greater than the dielectric constant of $SiO_2$ (e.g., greater than about 3.9).

As used herein, the term "low-k" refers to a small dielectric constant. In the field of semiconductor device structures and manufacturing processes, low-k refers to a dielectric constant that is less than the dielectric constant of $SiO_2$ (e.g., less than about 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

As used herein, the term "vertical," means nominally along a direction perpendicular to the surface of a substrate.

As used herein, the term "crossover," means structures along directions crossing at a point.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

Embodiments of the fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, forming patterns that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

With advances in semiconductor technology, multi-gate devices have been introduced in an effort to improve gate control by increasing gate-channel coupling, reduce off-state current, and reduce short-channel effects (SCEs). One such multi-gate device that has been introduced is the gate-all-around fin field effect transistor (GAA finFET). The GAA finFET device provides a channel in a stacked nanosheets/nanowires configuration. The GAA finFET device derives its name from the gate structure that can extend around the channel and provide gate control of the channel on two or four sides of the channel. GAA finFET devices are compatible with MOSFET manufacturing processes and their structure allows them to be scaled while maintaining gate control and mitigating SCEs.

With increasing demand for lower power consumption, high performance, and small area (collectively referred to as "PPA") of semiconductor devices, GAA finFET devices can have their challenges. For example, the stacked nanosheets/nanowires can have undesirable parasitic capacitance between each layer, which can negatively affect device performance of GAA finFET devices. In addition, the stacked nanosheets/nanowires can have reduced active channel area compared with a continuous fin channel, and increasing the number of stacked nanosheets/nanowires layers can increase the parasitic capacitance.

Various embodiments in the present disclosure provide methods for forming a semiconductor device with a negative capacitance (NC) layer. Negative capacitance (NC) can refer to a decrease in voltage across a capacitor with an increase in charge on the capacitor. Negative capacitance can be found in dielectric and/or ferroelectric materials. The NC of dielectric and/or ferroelectric materials can be applied to devices for improved device performance. The example methods in the present disclosure can form a semiconductor device having a first set of semiconductor layers, a second set of semiconductor layers over the first set of semiconductor layers, and an NC layer between the first and second sets of semiconductor layers.

In some embodiments, the NC dielectric materials can include a dielectric material with ferroelectric properties, a dielectric material in orthorhombic phase (e.g., hafnium oxide ($HfO_2$) in orthorhombic phase), and/or a dielectric material (e.g., $HfO_2$) doped with one or more dopants, such as aluminum (Al), gadolinium (Gd), silicon (Si), yttrium (Y), zirconium (Zr), and a combination thereof. NC layers in a GAA finFET device can reduce a subthreshold swing (SS) through an internal voltage amplification mechanism and increase channel on-current to off-current (Ion/Ioff) ratio of the GAA finFET device. The SS can represent the current on-off switching characteristics of the GAA finFET device and can be a factor in determining the switching speed of the GAA finFET device. The reduction of SS in the GAA finFET device can achieve faster device operation along with lower switching energy, and can effectively scale down the supply voltage and significantly lower the power consumption in GAA finFET devices. In some embodiments, the power consumption of GAA finFET devices with an NC layer can be reduced by about 10% to about 40% compared with GAA finFET devices without NC layers.

In some embodiments, the NC layer between semiconductor layers of the GAA finFET devices can reduce parasitic capacitances of the GAA finFET devices. The parasitic capacitance can arise from an electrical coupling between one signal line and another signal line or a signal line and the substrate of the GAA finFET device, thus negatively impacting device performance at high frequencies. In some embodiments, the NC layer can be disposed between two semiconductor layers and in contact with gate dielectric layers wrapped around each of the two semiconductor layers. In some embodiments, the GAA finFET devices can include more than one NC layer (e.g., two NC layers) between the semiconductor layers. In some embodiments, the NC layer can include two regions in contact with each other. In some embodiments, a first fin structure with a first NC layer can be stacked on a second fin structure with a second NC layer to further reduce parasitic capacitances and improve device performance of the GAA finFET device. In some embodiments, device performance of GAA finFET devices with one or more NC layers can be improved by about 10% to about 40% compared with GAA finFET devices without NC layers.

Figure 1A:
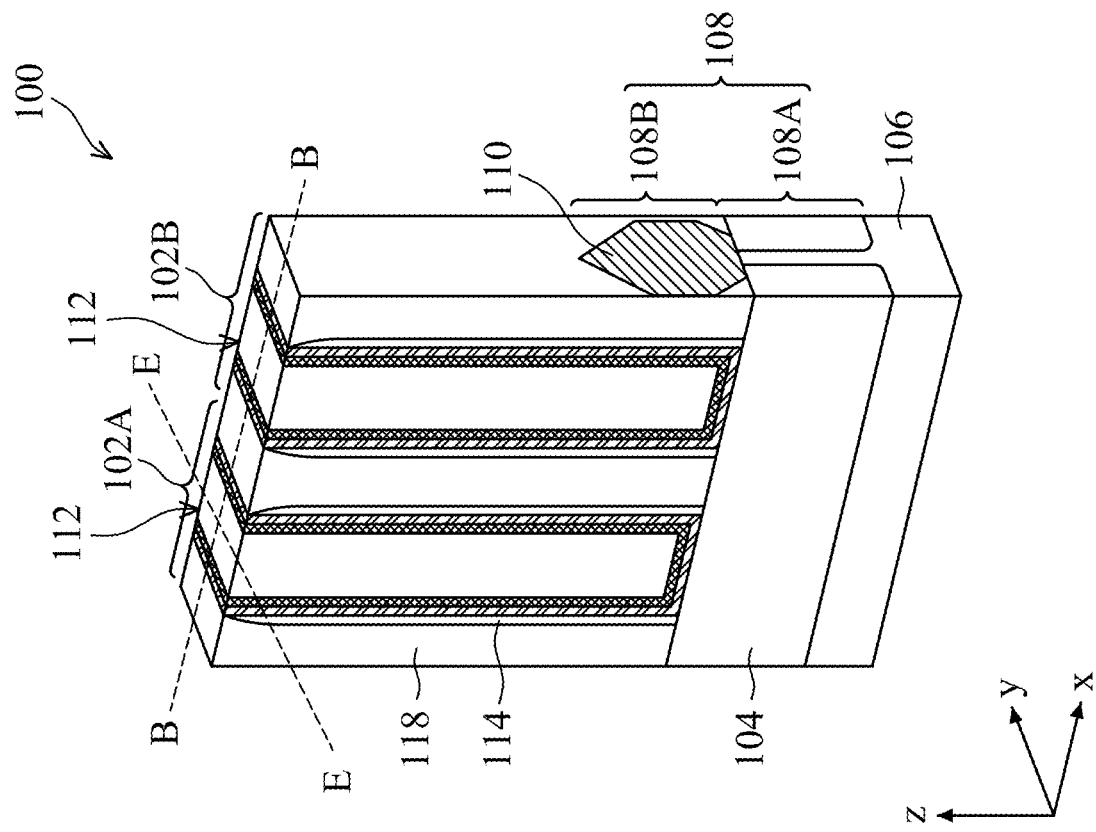
Figure 1G:
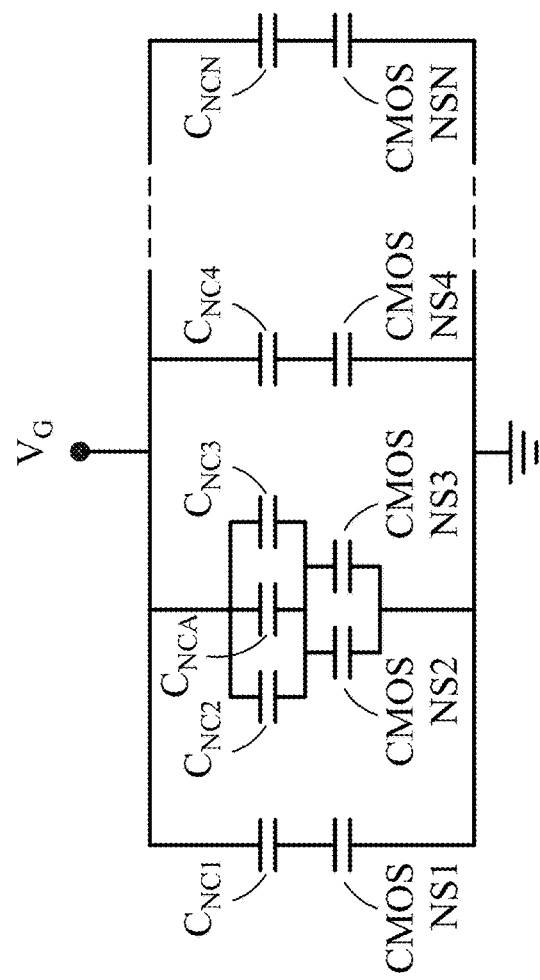
FIGS. 1F and 1G illustrate various capacitances in a semiconductor device with an NC layer and a circuit diagram of the various capacitances, respectively, in accordance with some embodiments.
Figure 1F:
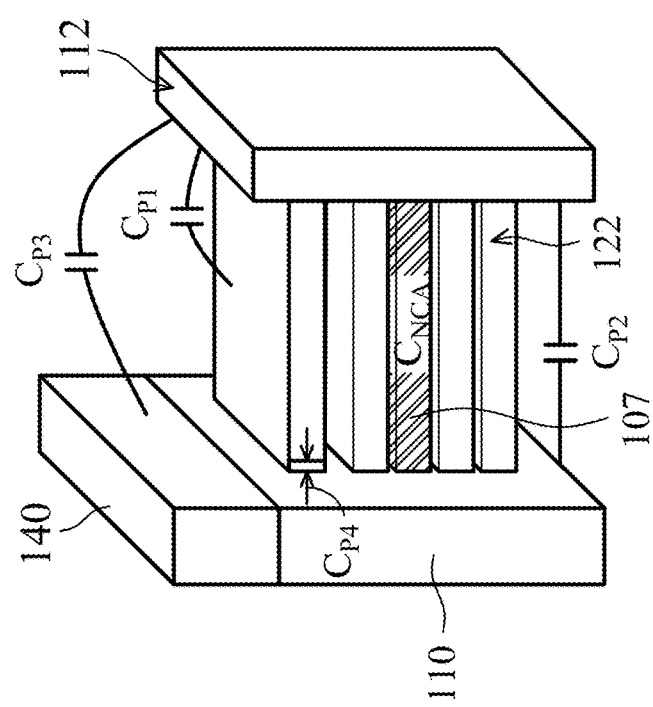

A semiconductor device 100 having finFETs 102A-102B is described with reference to FIGS. 1A-1G, according to some embodiments. FIG. 1A illustrates an isometric view of semiconductor device 100 with a negative capacitance (NC) layer 107, according to some embodiments. FIG. 1B illustrates a cross-sectional view along line B-B of semiconductor device 100 with NC layer 107, according to some embodiments. FIG. 1C illustrates a zoomed-in area C of the cross-sectional view of FIG. 1B, FIG. 1D illustrates a zoomed-in area D of the cross-sectional view of FIG. 1C, and FIG. 1E illustrates a partial cross-sectional view along line E-E of semiconductor device 100 with NC layer 107 in FIG. 1A, according to some embodiments. FIG. 1F illustrates various capacitances in semiconductor device 100 with NC layer 107, and FIG. 1G illustrates a circuit diagram of the various capacitances, according to some embodiments.

In some embodiments, finFETs 102A-102B can be both p-type finFETs (PFETs), both n-type finFETs (NFETS), or one of each conductivity type finFET. Though FIGS. 1A-1C show two GAA finFETs, semiconductor device 100 can have any number of GAA finFETs. In addition, semiconductor device 100 can be incorporated into an integrated circuit (IC) through the use of other structural components, such as contacts, conductive vias, conductive lines, dielectric layers, passivation layers, interconnects, etc., that are not shown for simplicity. The discussion of elements of finFETs 102A-102B with the same annotations applies to each other, unless mentioned otherwise.

Referring to FIGS. 1A and 1B, finFETs 102A-102B can be formed on a substrate 106. Substrate 106 can be a semiconductor material, such as silicon (Si). In some embodiments, substrate 106 can include a crystalline silicon substrate (e.g., wafer). In some embodiments, substrate 106 can include (i) an elementary semiconductor, such as germanium (Ge); (ii) a compound semiconductor, such as silicon carbide (SiC); (iii) an alloy semiconductor, such as silicon germanium (SiGe); (iv) a silicon-on-insulator (SOI) structure; (v) a silicon germanium (SiGe)-on insulator structure (SiGeOI); (vi) germanium-on-insulator (GeOI) structure; and (vii) a combination thereof. Further, substrate 106 can be doped depending on design requirements (e.g., p-type substrate or n-type substrate). In some embodiments, substrate 106 can be doped with p-type dopants (e.g., boron, indium, aluminum, or gallium) or n-type dopants (e.g., phosphorus or arsenic).

Referring to FIGS. 1A-1F, finFETs 102A-102B can further include STI regions 104, a fin structure 108, gate structures 112, and gate spacers 114. STI regions 104 can provide electrical isolation between finFET 102A and finFET 102B from each other and from neighboring finFETs with different fin structures (not shown) on substrate 106 and/or neighboring active and passive elements (not shown) integrated with or deposited on substrate 106. STI regions 104 can be made of a dielectric material. In some embodiments, STI regions 104 can include silicon oxide, silicon nitride, silicon oxynitride, fluorine-doped silicate glass (FSG), a low-k dielectric material, and/or other suitable insulating materials. In some embodiments, STI regions 104 can include a multi-layered structure.

Fin structure 108 can extend along an X-axis and through finFETs 102A-102B. Fin structure 108 can include a fin base portion 108A and a fin top portion 108B disposed on fin base portion 108A. In some embodiments, fin base portion 108A can include material similar to substrate 106. Fin base portion 108A can be formed from a photolithographic patterning and an etching of substrate 106. In some embodiments, fin top portion 108B can include stacked fin portions $108B_1$ and $108B_2$ and epitaxial fin regions 110. Each of stacked fin portions $108B_1$ and $108B_2$ can include a stack of semiconductor layers 122-1, 122-2, 122-3, and 122-4 (collectively referred to as "semiconductor layers 122"), which can be in the form of nanosheets or nanowires. Each of semiconductor layers 122 can form a channel region underlying gate structures 112 of finFETs 102A-102B.

In some embodiments, semiconductor layers 122 can include semiconductor materials similar to or different from substrate 106. In some embodiments, each of semiconductor layers 122 can include Si without any substantial amount of Ge. The semiconductor materials of semiconductor layers 122 can be undoped or can be in-situ doped during their epitaxial growth process. Semiconductor layers 122 can have respective vertical dimensions 122t (e.g., thicknesses) along a Z-axis, each ranging from about 5 nm to about 10 nm. Other dimensions and materials for semiconductor layers 122 are within the scope and spirit of this disclosure. Though four layers of semiconductor layers 122 are shown in FIGS. 1A-1G, finFETs 102A-102B can have any number of semiconductor layers 122.

Referring to FIGS. 1A-1G, NC layer 107 can be disposed between semiconductor layers 122-2 and 122-3, according to some embodiments. NC layer 107 can include an NC dielectric material with ferroelectric properties, such as hafnium oxide ($HfO_2$), hafnium aluminum oxide (HfAlO), hafnium silicate (HfSiO), hafnium zirconium oxide (HfZrO), or the like. NC layer 107 can be formed using sputtering, PVD, CVD, or other suitable processes. The ferroelectric property of the dielectric material of NC layer 107 can be affected by various factors including, but not limited to, the atomic elements of the dielectric material, the atomic percentage of the atomic elements, and/or the phase of the crystal structure of the dielectric material. The phase can also be affected by the deposition process conditions and post-treatment conditions for forming the dielectric material. Thus, a dielectric material having the same atomic elements and/or the same atomic percentages of the atomic elements as the dielectric material of NC layer 107 may not exhibit negative capacitance property, and thus, many not be considered as an NC dielectric material.

In some embodiments, NC layer 107 can include a high-k dielectric material in orthorhombic phase (e.g., high-k $HfO_2$ in orthorhombic phase) and/or a high-k dielectric material subjected to one or more treatment method, such as doping, stressing, and/or thermal annealing. In some embodiments, NC layer 107 can include a stable orthorhombic phase NC dielectric material formed by doping and/or thermal annealing $HfO_2$ with metals, such as aluminum (Al), gadolinium (Gd), silicon (Si), yttrium (Y), zirconium (Zr), and/or a combination thereof. Other materials and formation methods for NC dielectric materials of NC layer 107 are within the scope and spirit of this disclosure.

In some embodiments, NC layer 107 can have a vertical dimension 107t (e.g., thickness) along a Z-axis ranging from about 6 nm to about 18 nm with orthorhombic phase. If vertical dimension 107t is less than 6 nm, NC dielectric material may not convert from as-deposited monoclinic phase to orthorhombic phase after anneal. If vertical dimension 107t is greater than 18 nm, NC layer 107 may have mixed monoclinic, tetragonal, and orthorhombic crystalline phases, which can reduce the negative capacitance property of NC layer. In some embodiments, a cross-sectional view of NC layer 107 in FIGS. 1B-1D can have an "H" shape rotated about 90 degrees. NC layer 107 can have a horizontal dimension 107w1 (e.g., width) at a top portion of the rotated "H" shape along an X-axis ranging from about 10 nm to about 50 nm and a horizontal dimension 107w2 (e.g., width) at a middle portion of the rotated "H" shape along an X-axis ranging from about 5 nm to about 45 nm. In some embodiments, a ratio of 107w2 to 107w1 can range from about 0.5 to about 0.95. If the ratio is less than about 0.5, NC layer 107 may not reduce parasitic capacitance of semiconductor device 100. If the ratio is greater than about 0.9, the process to form NC layer 107 may become more complicated while the effect of parasitic capacitance reduction by NC layer 107 may saturate.

In some embodiments, NC layer 107 of finFETs 102A-102B can reduce subthreshold swing through internal voltage amplification mechanism, and thus scale down the supply voltage and lower power dissipation of finFETs 102A-102B. The negative capacitance effect of NC layer 107 can overcome the lower limit of voltage operation and achieve faster operation along with lower switching energy for finFETs 102A-102B. In some embodiments, NC layer 107 can reduce the parasitic capacitances and improve device performance of finFETs 102A-102B.

Referring to FIGS. 1A-1G, epitaxial fin regions 110 can be disposed between stacked fin portions $108B_1$ and $108B_2$, respectively. In some embodiments, epitaxial fin regions 110 can have any geometric shape, such as a polygon, an ellipsis, and a circle. Epitaxial fin regions 110 can include an epitaxially-grown semiconductor material. In some embodiments, the epitaxially grown semiconductor material includes a same material as or different material from substrate 106. In some embodiments, the epitaxially-grown semiconductor material for epitaxial fin regions 110 can be the same as or different from each other.

Referring to FIGS. 1A-1G, gate structures 112 can be multi-layered structures and can be wrapped around semiconductor layers 122 of stacked fin portions $108B_1$ and $108B_2$. In some embodiments, each of semiconductor layers 122 can be wrapped around by one of gate structures 112 or one or more layers of one of gate structures 112 respectively, for which gate structures 112 can be referred to as "gate-all-around (GAA) structures" and finFETs 102A and 102B can also be referred to as "GAA FETs 102A-102B" or "GAA finFETs 102A-102B."

Each of gate structures 112 can include a gate dielectric layer 112A disposed on semiconductor layers 122 and a gate electrode 112B disposed on gate dielectric layer 112A. As shown in FIG. 1E, gate dielectric layer 112A can be wrapped around each of semiconductor layers 122, and thus, electrically isolate semiconductor layers 122 from each other and from conductive gate electrode 112B to prevent shorting between gate structures 112 and semiconductor layers 122 during operation of finFETs 102A-102B.

Referring to FIG. 1C, each gate dielectric layer 112A can include an interfacial layer (IL) 109 and a negative capacitance high-k (NC HK) layer 111. In some embodiments, IL 109 can include silicon oxide and have a thickness $109t$ ranging from about 0.5 nm to about 1.0 nm. In some embodiments, NC HK layer 111 can include an NC dielectric material same as or different from NC layer 107. In some embodiments, NC HK layer 111 can include a stable orthorhombic phase NC dielectric material formed by doping and/or thermal annealing $HfO_2$ with metals, such as aluminum (Al), gadolinium (Gd), silicon (Si), yttrium (Y), zirconium (Zr), and a combination thereof. Though NC dielectric materials of NC HK layer 111 can include the same atomic elements as high-k dielectric materials, NC HK layer 111 can have different properties than high-k dielectric materials. For example, the NC dielectric material of NC HK layer 111 can have a resistivity lower than the respective high-k dielectric material that has the same type of atomic elements. In some embodiments, NC HK layer 111 can have a thickness $111t$ ranging from about 1.5 nm to about 3.0 nm.

In some embodiments, each gate electrode 112B can include a gate barrier layer (not shown), a gate work function layer 130, and a gate metal fill layer 132. As shown in FIG. 1E, each of semiconductor layers 122 can be wrapped around by one of gate barrier layers and one of gate work function layer 130. Depending on the spaces between adjacent semiconductor layers 122 and the thicknesses of the layers of gate structures 112, semiconductor layers 122 can be wrapped around by one or more layers of gate electrode 112B filling the spaces between adjacent semiconductor layers 122. Though FIG. 1E shows gate metal fill layer 132 partially wrapped around semiconductor layers 122, gate metal fill layer 132 can also wrap around semiconductor layers 122 to fill the spaces between adjacent semiconductor layers 122 (not shown), according to some embodiments.

In some embodiments, gate barrier layers can serve as nucleation layers for subsequent formation of gate work function layer 130 and/or can help to prevent substantial diffusion of metals (e.g., Al) from gate work function layer 130 to underlying layers (e.g., gate dielectric layer 112A or oxide layers). In some embodiments, each gate work function layer 130 can include a single metal layer or a stack of metal layers. The stack of metal layers can include metals having work function values equal to or different from each other. In some embodiments, each gate metal fill layer 132 can include a single metal layer or a stack of metal layers. The stack of metal layers can include metals different from each other. Though gate structures 112 of finFETs 102A-102B are shown to be similar, finFETs 102A-102B can have gate structures with materials and/or electrical properties (e.g., threshold voltage and work function value) different from each other. Also, though gate structures 112 are shown to have horizontal GAA structures, other gate structures (e.g., vertical GAA structures) are within the scope and spirit of this disclosure Referring to FIGS. 1A-1B, gate spacers 114 can form on sidewalls of gate structures 112 and can be in physical contact with portions of gate dielectric layer 112A, according to some embodiments. Gate spacers 114 can include insulating material, such as silicon oxide, silicon nitride, a low-k material, and a combination thereof. Gate spacer 114 can include a single layer or a stack of insulating layers. Gate spacers 114 can have a low-k material with a dielectric constant less than about 3.9 (e.g., about 3.5, about 3.0, or about 2.8).

Referring to FIGS. 1A-1B, semiconductor device 100 can further include an interlayer dielectric (ILD) layer 118. ILD layer 118 can be disposed on epitaxial fin regions 110 and STI regions 104. ILD layer 118 can include a dielectric material deposited using a deposition method suitable for flowable dielectric materials. For example, flowable silicon oxide can be deposited using flowable CVD (FCVD). In some embodiments, the dielectric material is silicon oxide.

Referring to FIGS. 1A-1E, semiconductor device 100 can further include inner spacer structures 127. Inner spacer structures 127 can be disposed between semiconductor layers 122 and adjacent to epitaxial fin regions 110 and NC HK layer 111. Inner spacer structures 127 can include a dielectric material, such as SiOC, SiCN, SiOCN, SiN, silicon oxide ($SiO_x$), silicon oxynitride ($SiO_yN$), and a combination thereof. In some embodiments, inner spacer structures 127 can include a single layer or multiple layers of insulating materials. In some embodiments, inner spacer structures 127 can isolate gate structures 112 and epitaxial fin regions 110. In some embodiments, inner spacer structures 127 can have a thickness $127t$ along an X-axis ranging from about 3 nm to about 7 nm. In some embodiments, inner spacer structures adjacent to NC layer 107 can have two regions, a first region 127A between semiconductor layers 122-2 and 122-3 and a second region 127B between the NC dielectric materials of NC layer 107. In some embodiments, second region 127B of inner spacer structures 127 can have a width along an an X-axis ranging from about 3 nm to about 5 nm, and a height along a Z-axis ranging from about 7 nm to about 11 nm.

Referring to FIG. 1F, according to some embodiments, capacitances in semiconductor device 100 with NC layer 107 can include a fringe capacitance $C_{P1}$ between gate structures 112 and semiconductor layers 122, a parallel plate capacitance $C_{P2}$ between gate structures 112 and a source region (e.g., epitaxial fin regions 110), a fringe capacitance $C_{P3}$ between gate structures 112 and a source contact 140, an overlap capacitance $C_{P4}$ between epitaxial fin regions 110 and semiconductor layers 122, and a negative capacitance $C_{NCA}$ of NC layer 107.

FIG. 1G illustrates a circuit diagram of the various capacitances in semiconductor device 100 with NC layer 107, according to some embodiments. In some embodiments, CMOS NS1 can represent capacitances of $C_{P1}$, $C_{P2}$, $C_{P3}$, and $C_{P4}$ between gate structures 112 wrapped around semiconductor layer 122-1 and a ground. CMOS NS2-CMOS NCN can represent similar capacitances for semiconductor layer 122-2, 122-3, 122-4, and 122-n, where n can represent the number of semiconductor layers 122 and can be an integer larger than 1. $C_{NC1}$ can represent capacitances of NC HK layer 111 wrapped around semiconductor layer 122-1. $C_{NC1}$-$C_{NCN}$ can similarly represent capacitances of NC HK layer 111 wrapped around semiconductor layers 122-2, 122-3, 122-4, and 122-n. $C_{NCA}$ can represent capacitances of NC layer 107. In some embodiments, $C_{NCA}$ can connect to $C_{NC2}$ and $C_{NC3}$ in parallel and connect to CMOS NS2 and CMOS NS3 in series, as shown in FIG. 1G. In some embodiments, $C_{NCA}$, together with $C_{NC1}$-$C_{NCN}$, can reduce power consumption and improve device performance for finFETs 102A-102B.

Figures 2A, 2B:
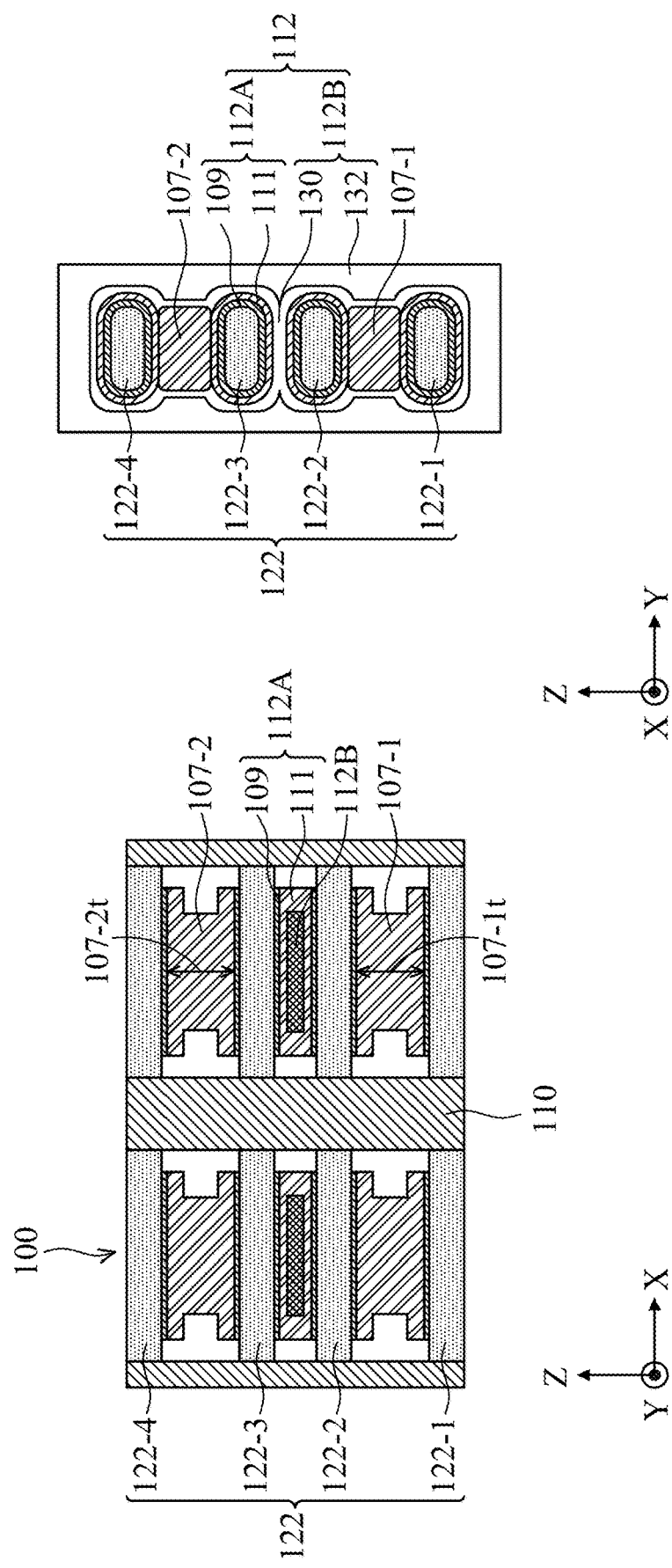
FIGS. 2A and 2B illustrate partial cross-sectional views of a semiconductor device with two NC layers, respectively, in accordance with some embodiments.

FIGS. 2A and 2B illustrate partial cross-sectional views of semiconductor device 100 with two NC layers 107-1 and 107-2, in accordance with some embodiments. Elements in FIGS. 2A-2B with the same annotations as elements in FIGS. 1A-1E are described above. As shown in FIG. 2A, NC layers 107-1 and 107-2 can include NC dielectric materials with ferroelectric properties similar to NC layer 107. NC layer 107-1 can be disposed between semiconductor layers 122-1 and 122-2. NC layer 107-2 can be disposed between semiconductor layers 122-3 and 122-4. In some embodiments, NC layer 107-1 can include an NC dielectric material the same as NC layer 107-2. In some embodiments, NC layer 107-1 can include an NC dielectric material different from NC layer 107-2. In some embodiments, each of NC layers 107-1 and 107-2 can have a vertical dimension 107-1t and 107-2t (e.g., thicknesses) along a Z-axis ranging from about 5 nm to about 18 nm, respectively. In some embodiments, semiconductor device 100 can include more than two NC layers to further reduce power consumption and improve device performance of semiconductor device 100.

Figures 2C, 2D:
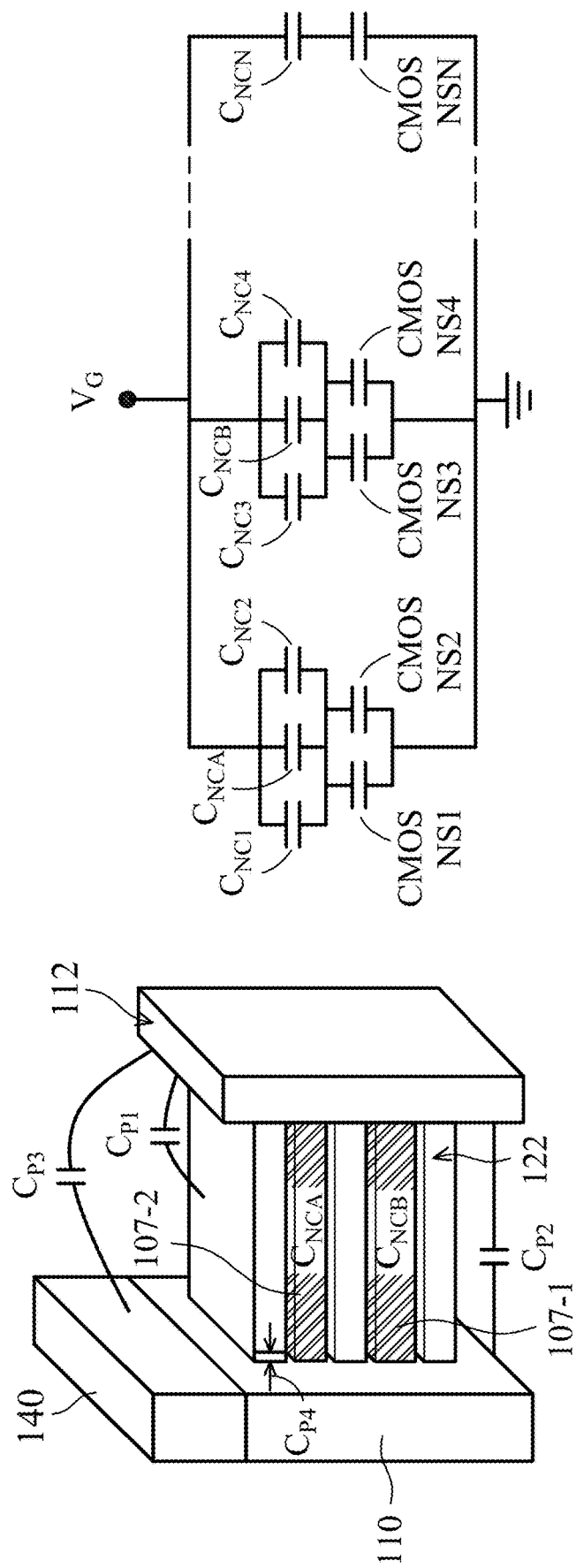
FIGS. 2C and 2D illustrate various capacitances in a semiconductor device with two NC layers and a circuit diagram of the various capacitances, respectively, in accordance with some embodiments.

FIGS. 2C and 2D illustrate various capacitances in semiconductor device 100 with two NC layers 107-1 and 107-2 and a circuit diagram of the various capacitances, respectively, in accordance with some embodiments. Elements in FIGS. 2C-2D with the same annotations as elements in FIGS. 1F-1G are described above. As shown in FIG. 2C, $C_{NCA}$ can represent capacitances of NC layer 107-1, and $C_{NCB}$ can represent capacitances of NC layer 107-2. In some embodiments, $C_{NCA}$ can connect to $C_{NC1}$ and $C_{NC2}$ in parallel and connect to CMOS NS1 and CMOS NS2 in series, and $C_{NCB}$ can connect to $C_{NC3}$ and $C_{NC4}$ in parallel and connect to CMOS NS3 and CMOS NS4 in series, as shown in FIG. 2D. In some embodiments, $C_{NCA}$ and $C_{NCB}$, together with $C_{NC1}$-$C_{NCN}$, can further reduce power consumption and improve device performance of finFETs 102A-102B.

Figure 3:
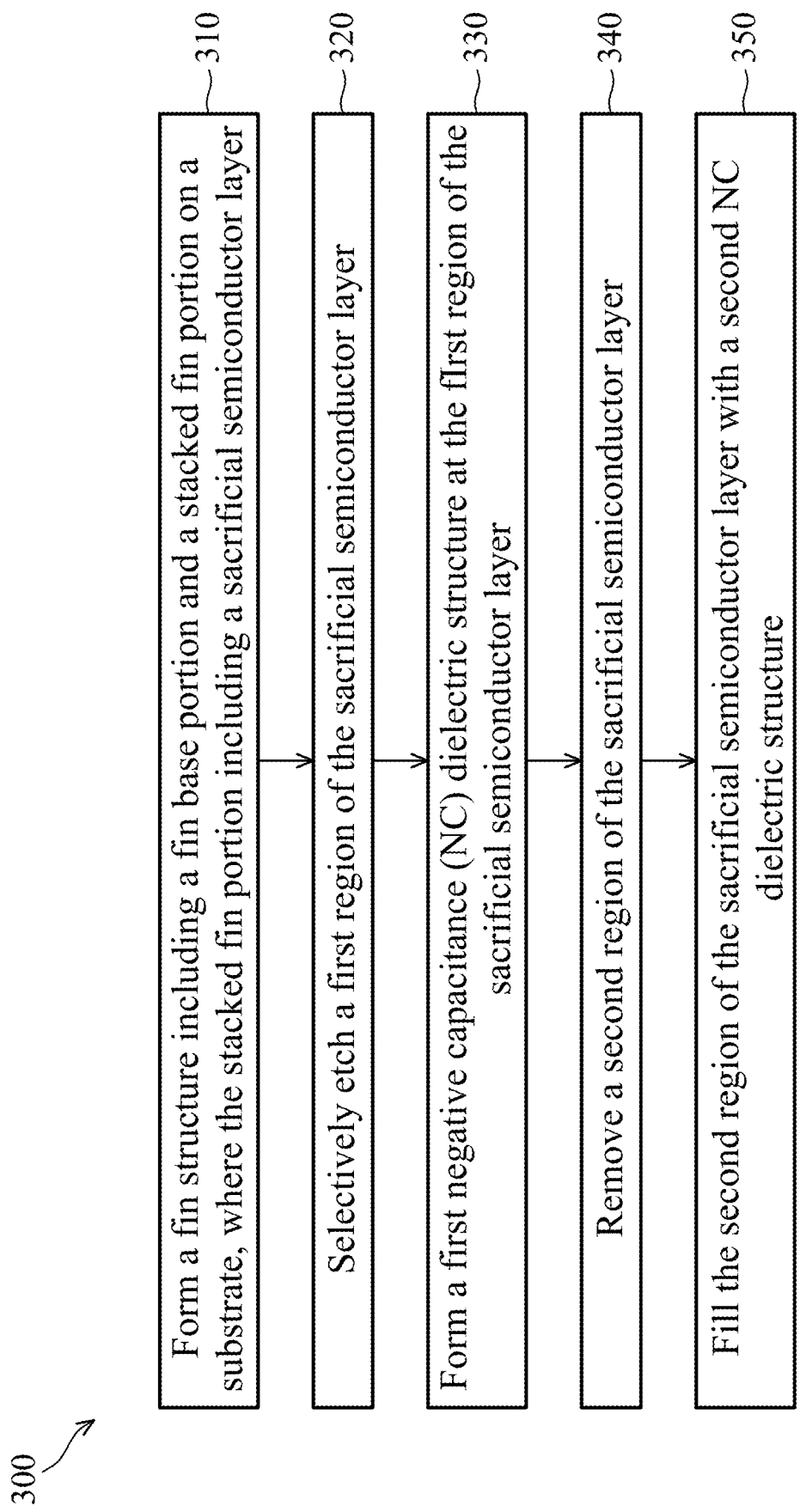
FIG. 3 is a flow diagram of a method for fabricating a semiconductor device with an NC layer, in accordance with some embodiments.

FIG. 3 is a flow diagram of a method 300 for fabricating semiconductor device 100 with NC layer 107, in accordance with some embodiments. Additional fabrication operations may be performed between various operations of method 300 and may be omitted merely for clarity and ease of description. Additionally, some of the operations may be performed simultaneously, or in a different order than the ones shown in FIG. 3. Accordingly, additional processes can be provided before, during, and/or after method 300; these additional processes can be briefly described herein. For illustrative purposes, the operations illustrated in FIG. 3 will be described with reference to the example fabrication process for fabricating semiconductor device 100 as illustrated in FIGS. 4-13. FIGS. 4-13 are partial cross-sectional views of semiconductor device 100 along line B-B of FIG. 1A at various stages of its fabrication, according to some embodiments. Although FIGS. 4-13 illustrate fabrication processes of semiconductor device 100 with NC layer 107, method 300 can be applied to semiconductor device 100 with NC layers 107-1 and 107-2 and other semiconductor devices. Elements in FIGS. 4-13 with the same annotations as elements in FIGS. 1A-1E are described above.

Figures 4, 5:
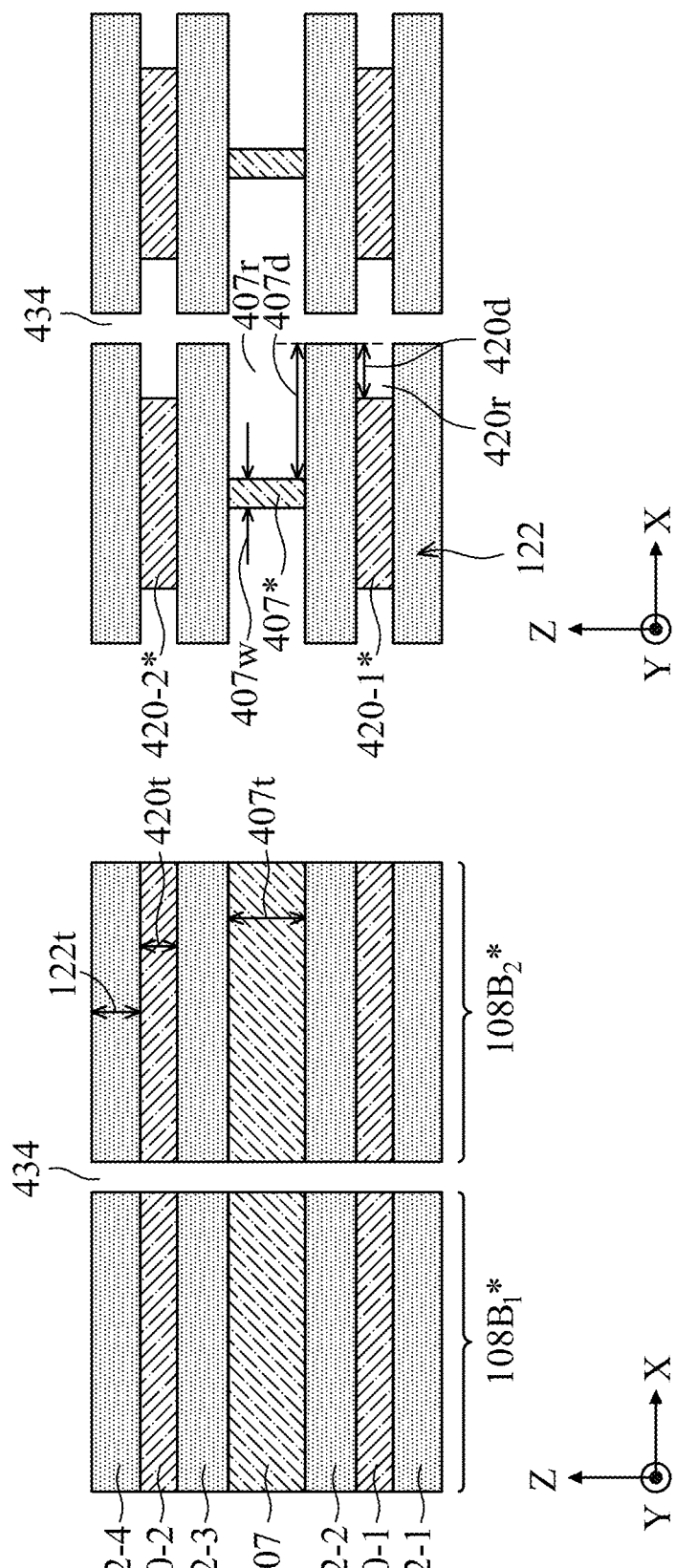
FIGS. 4-13 illustrate partial cross-sectional views of a semiconductor device with an NC layer at various stages of its fabrication process, in accordance with some embodiments.

In referring to FIG. 3, method 300 begins with operation 310 and the process of forming a fin structure including a fin base portion and a stacked fin portion on a substrate. The stacked fin portion includes a first set of semiconductor layers on the fin base portion, a second set of semiconductor layers above the first set of semiconductor layers, and a sacrificial semiconductor layer between the first and second sets of semiconductor layers. For example, as shown in FIGS. 1A, 1B, and 4, fin structure 108 with fin base portion 108A and stacked fin portions $108B_1$ and $108B_2$ can be formed on substrate 106. Stacked fin portions $108B_1$* and $108B_2$* can include a first set of semiconductor layers 122-1, 122-2, and 420-1, a second set of semiconductor layers 122-3, 122-4, and 420-2, and a sacrificial semiconductor layer 407 between the first and second sets of semiconductor layers.

Each semiconductor layer in stacked fin portions $108B_1$* and $108B_2$* can be epitaxially grown on its underlying layer followed by a vertical etch to form an opening 434. In some embodiments, S/D regions can be formed in opening 434 in subsequent processes. In some embodiments, the vertical etch of sacrificial semiconductor layer 407 and semiconductor layers 122, 420-1, and 420-2 can include a biased etching process. In some embodiments, the biased etching process can be directional and sacrificial semiconductor layer 407 and semiconductor layers 122, 420-1 and 420-2 can have substantially no lateral etch.

Stacked fin portions $108B_1$* and $108B_2$* can include semiconductor materials different from each other. In some embodiments, semiconductor layers 420-1 and 420-2 (collectively referred to as "semiconductor layers 420") and 122 can include semiconductor materials similar to or different from substrate 106. In some embodiments, semiconductor layers 420 and 122 can include semiconductor materials with oxidation rates and/or etch selectivity different from each other. In some embodiments, semiconductor layers 420 can include silicon germanium (SiGe) with Ge in a range from about 5 atomic percent to about 20 atomic percent with any remaining atomic percent being Si. In some embodiments, semiconductor layers 122 can include Si without any substantial amount of Ge. Semiconductor layers 420 can have a vertical dimension 420t (e.g., thickness) along a Z-axis ranging from about 5 nm to about 12 nm. Semiconductor layers 122 can have a vertical dimension 122t (e.g., thickness) along a Z-axis ranging from about 5 nm to about 10 nm. Vertical dimensions 420t and 122t can be equal to or different from each other. Though four semiconductor layers 122 and two semiconductor layers 420 for stacked fin portions 108B$_1$* and 108B$_2$* are shown in FIG. 4, semiconductor device 100 can have any number of semiconductor layers 420 and 122.

In some embodiments, sacrificial semiconductor layer 407 can include semiconductor materials similar to or different from semiconductor layers 420 and 122. In some embodiments, sacrificial semiconductor layer 407 can include SiGe with Ge in a range from about 20 atomic percent to about 40 atomic percent with any remaining atomic percent being Si. In some embodiments, sacrificial semiconductor layer 407 can include SiGe with a higher Ge concentration than semiconductor layers 420 for a higher etch rate, and a difference between the Ge concentration in sacrificial semiconductor layer 407 and semiconductor layers 420 can range from about 10 atomic percent to about 15 atomic percent. If the difference is less than about 10 atomic percent, sacrificial semiconductor layer 407 may not have a higher etch rate than semiconductor layers 420 and sacrificial semiconductor layer 407 may not be replaced by NC layer 107. If the difference is greater than about 15 atomic percent, sacrificial semiconductor layer 407, semiconductor layers 420, and semiconductor layers 122 may have more epitaxial defects and stress between each layer. Sacrificial semiconductor layer 407 can have a thicknesses 407t along a Z-axis ranging from about 8 nm to about 15 nm. In some embodiments, thickness 407t can be greater than thickness 420t for a higher etch rate and a difference between 407t and 420t can range from about 3 nm to about 12 nm. In some embodiments, a ratio of 407t to 420t can range from about 1.2 to about 2. If the difference is less than about 3 nm or the ratio is less than about 1.2, sacrificial semiconductor layer 407 may not have a higher etch rate than semiconductor layers 420 and sacrificial semiconductor layer 407 may not be replaced by NC layer 107. If the difference is larger than about 12 nm or the ratio is larger than about 2, sacrificial semiconductor layer 407 may have different recess depths in various semiconductor devices of the IC in subsequent processes, which may cause seams or voids in NC layer 107.

Referring to FIG. 3, in operation 320, a first region of the sacrificial semiconductor layer is selectively etched. For example, as shown in FIG. 5, sacrificial semiconductor layer 407 and semiconductor layers 420 can be laterally etched and sacrificial semiconductor layer 407 can be selectively etched more than semiconductor layers 420. A first region of sacrificial semiconductor layer 407 can be etched and form a lateral recess 407r. The lateral etch can be performed by a dry etching process, a wet etching process, or a combination thereof. The etching process can include multiple cycles of etching and purging processes. The etching process in each cycle can include using a gas mixture having hydrogen fluoride (HF) and a fluorine-based gas. The purging process in each cycle can include using a gas mixture having HF and nitrogen (N$_2$). HF in the purging process can remove by-products and/or clean the surface of etched portions for subsequent cycles. The purging process can be longer than the etching process in each cycle.

In some embodiments, sacrificial semiconductor layer 407 can have a higher etch rate than semiconductor layers 420. In some embodiments, a higher Ge concentration and larger thickness 407t of sacrificial semiconductor layer 407 can lead to the higher etch rate than semiconductor layers 420. In some embodiments, the Ge concentration in sacrificial semiconductor layer 407 can be at least 10 atomic percent higher than the Ge concentration in semiconductor layers 420. In some embodiments, semiconductor layers 420 can be laterally etched and form a lateral recess 420r having a horizontal dimension 412d (e.g., depth) along an X-axis ranging from about 5 nm to about 10 nm. In some embodiments, lateral recess 407r formed at the first region of sacrificial semiconductor layer 407 can have a horizontal dimension 407d (e.g., depth) along an X-axis from about 8 nm to about 20 nm. In some embodiments, a second region 407* of sacrificial semiconductor layer 407 remains after the lateral etch. In some embodiments, second regions 407* of sacrificial semiconductor layer 407 can have curved surfaces (e.g., a concave shape with respect to second region 407*) after the lateral etch due to processing variations. In some embodiments, second region 407* can have a horizontal dimension 407w (e.g., width) along an X-axis less than about 15 nm. In some embodiments, sacrificial semiconductor layer 407 can be fully removed after the lateral etch and substantially no sacrificial semiconductor layer 407 remains.

Figures 6, 7:
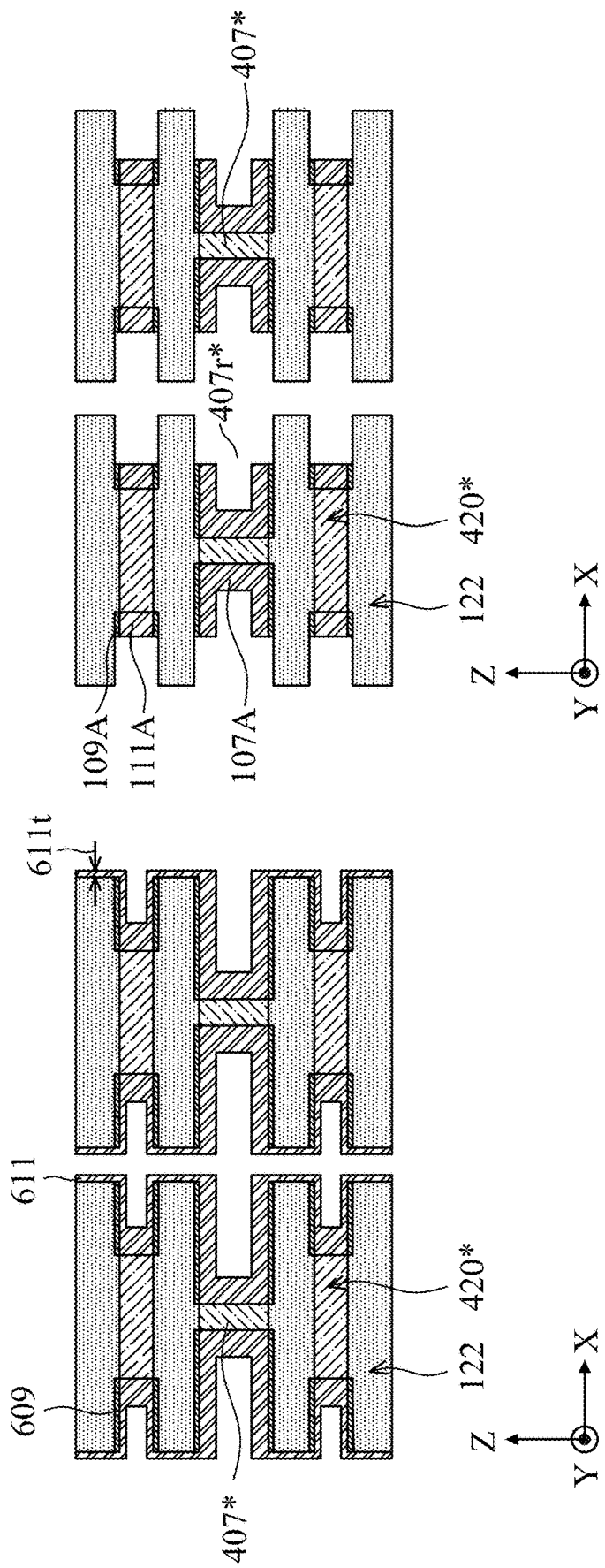

Referring to FIG. 3, in operation 330, a first negative capacitance (NC) dielectric structure is formed at the first region of the sacrificial semiconductor layer. For example, as shown in FIGS. 6 and 7, first NC dielectric structure 107A can be formed at the first region of sacrificial semiconductor layer 407. In some embodiments, the formation of the first NC dielectric structure can include formation of a first interfacial layer (IL) 609, a deposition of a first NC HK layer 611, and a lateral etch of first NC HK layer 611. In some embodiments, first IL 609 can include silicon oxide with a thickness ranging from about 0.5 nm to about 1 nm and can be formed during a chemical clean process. First IL 609 can help the growth of first NC HK layer 611 during its deposition.

First NC HK layer 611 can include NC dielectric materials described for NC layer 107 with reference to FIGS. 1A-1E. First NC HK layer 611 can be blanket deposited by thermal ALD. In some embodiments, the thermal ALD can use two precursors, one for the deposition of HfO$_2$, and another for the doping of HfO$_2$. First NC HK layer 611 can have a thickness 611t ranging from about 1.5 nm to about 3 nm.

The lateral etch of the first NC HK layer 611 can be performed on the blanket deposited first NC HK layer 611 to form first NC dielectric structure 107A within lateral recess 407r*, as shown in FIG. 7. In some embodiments, the etch process to form first NC dielectric structure 107A can include a wet etch process using diluted HF (DHF). After the etch process, first NC HK layer 611 can be removed from end portions of semiconductor layers 122, and a first portion 109A of IL 109 and a first portion 111A of NC HK layer 111 can be formed around semiconductor layers 122.

Figure 9:
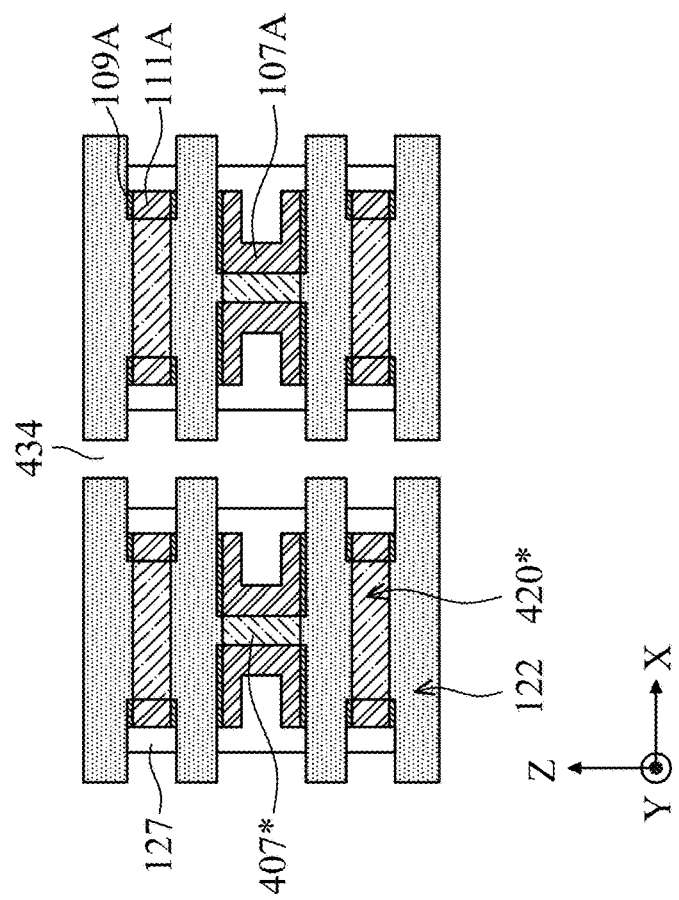
Figure 8:
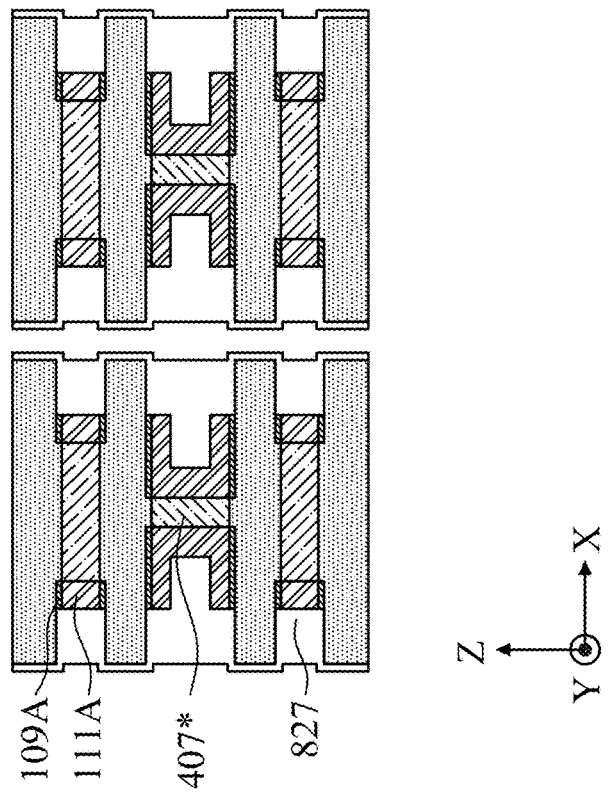
Figures 10, 11:
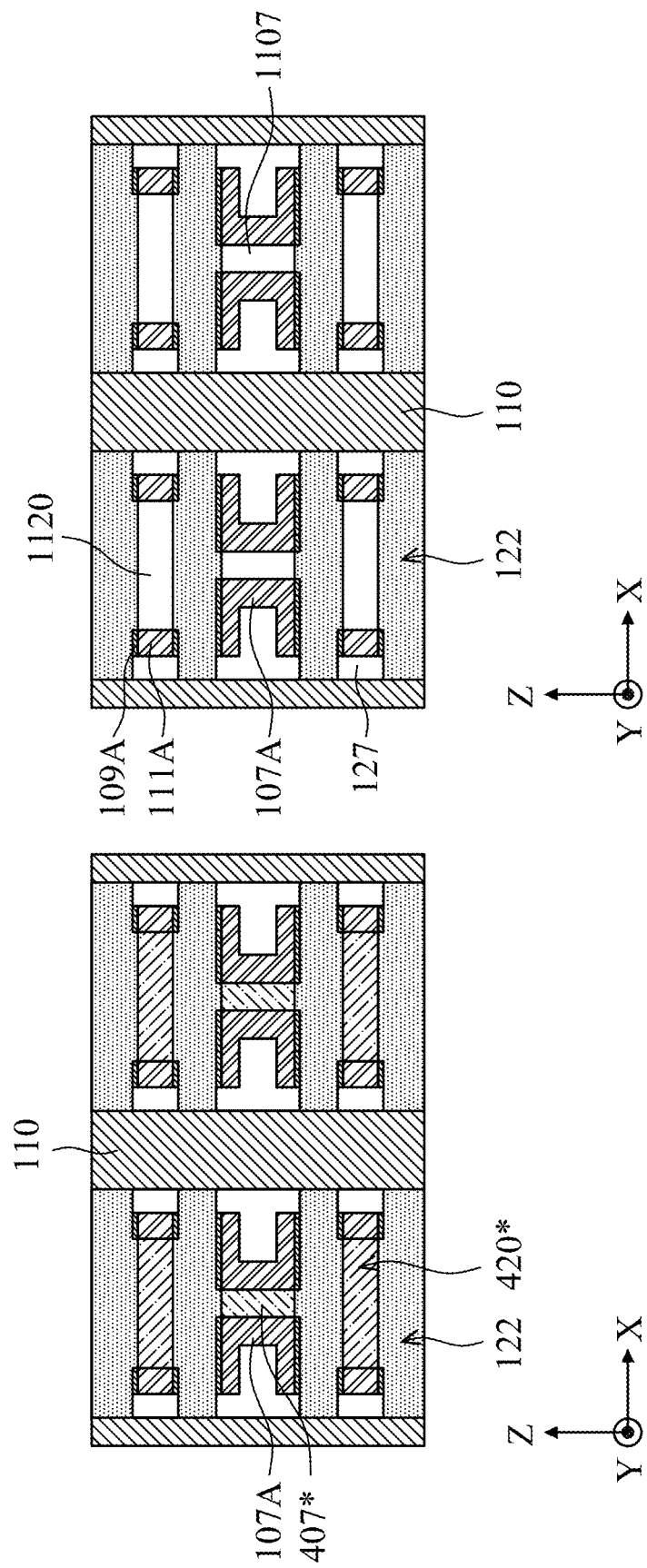

The formation of first NC dielectric structure 107A can be followed by formation of inner spacer structures 127 and epitaxial fin regions 110, as shown in FIGS. 8-10. The formation of inner spacer structures 127 can include a blanket deposition of an inner spacer layer 827 and a lateral etch of the blanket deposited inner spacer layer 827. In some embodiments, inner spacer layer 827 can include a single layer or a stack of dielectric layers, deposited by ALD, FCVD, or other suitable methods. The lateral etch of inner spacer layer 827 can be performed by a dry etch process using a gas mixture of HF and NH$_3$. After the lateral etch process, inner spacer structures 127 can be formed between semiconductor layers 122 and adjacent to first NC dielectric structure 107A, first portion 109A of IL 109, and first portion 111A of NC HK layer 111.

The formation of inner spacer structures 127 can be followed by formation of epitaxial fin regions 110, as shown in FIG. 10. In some embodiments, epitaxial fin regions 110 can grow on exposed surfaces of semiconductor layers 122 in opening 434. In some embodiments, epitaxial fin regions 110 can include multiple epitaxial fin sub-regions.

Referring to FIG. 3, in operation 340, a second region of the sacrificial semiconductor layer is removed. For example, as shown in FIG. 11, second region 407* of sacrificial semiconductor layer 407 and semiconductor layers 420* can be removed to form openings 1107 and 1120 respectively. In some embodiments, second region 407* and semiconductor layers 420* can be removed by an etching process similar to the etching process of the first region of sacrificial semiconductor layer 407. In some embodiments, the etching process can include using a gas mixture having hydrogen fluoride (HF) and a fluorine-based gas. After the etching process, second region 407* of sacrificial semiconductor layer 407 and semiconductor layers 420* can be removed between semiconductor layers 122.

Figure 12:
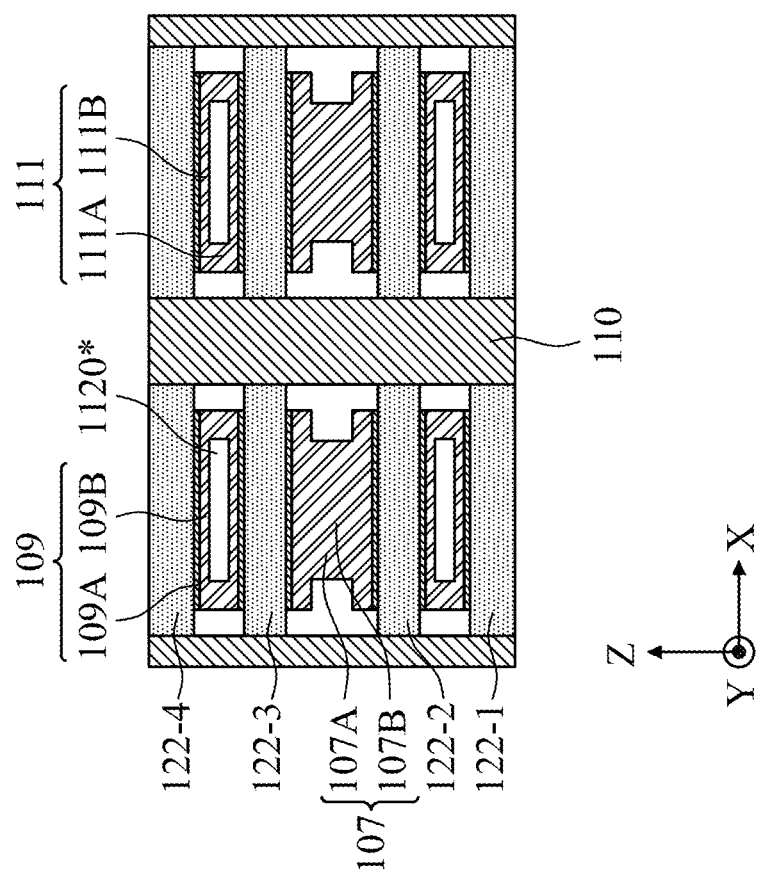

Referring to FIG. 3, in operation 350, the second region of the sacrificial semiconductor layer is filled with a second NC dielectric structure. The second NC dielectric structure is adjacent to the first NC dielectric structure. For example, as shown in FIG. 12, after removal of second region 407* of sacrificial semiconductor layer 407, second NC dielectric structure 107B can fill second region 407* (opening 1107 in FIG. 11). Second NC dielectric structure 107B can be adjacent to first NC dielectric structure 107A. In some embodiments, second NC dielectric structure 107B can include an NC dielectric material the same as first NC dielectric structure 107A. In some embodiments, second NC dielectric structure 107B can include an NC dielectric material different from first NC dielectric structure 107A. First NC dielectric structure 107A and second NC dielectric structure 107B can form NC layer 107 to replace sacrificial semiconductor layer 407. The negative capacitance of NC layer 107 and NC HK layer 111 can reduce parasitic capacitance and improve device performance of finFETs 102A-102B. NC layer 107 can also reduce SS through internal voltage amplification mechanism and reduce power consumption of finFETs 102A-102B.

In some embodiments, NC layer 107 can have a vertical dimension 107t (e.g., thickness) along a Z-axis ranging from about 6 nm to about 18 nm with orthorhombic phase. If vertical dimension 107t is less than 6 nm, NC dielectric material may not be convert from as-deposited monoclinic phase to orthorhombic phase after anneal. If vertical dimension 107t is greater than 18 nm, NC layer 107 may have mixed monoclinic, tetragonal, and orthorhombic crystalline phases, which can reduce the negative capacitance property of NC layer.

In some embodiments, the formation of second NC dielectric structure 107B can include formation of a second portion 109B of IL 109 and formation of a second portion 111B of NC HK layer 111. In some embodiments, second portion 109B of IL 109 can include silicon oxide with a thickness ranging from about 0.5 nm to about 1 nm and can be formed during a chemical clean process. In some embodiments, formation of second portion 111B of NC HK layer 111 can include a blanket deposition of NC dielectric materials described for NC layer 107 with reference to FIGS. 1A-1E. Second portion 111B of NC HK layer 111 can be blanket deposited by thermal ALD, similar to first portion 111A of NC HK layer 111. After blanket deposition of second portion 111B of NC HK layer, second region 407* can be filled with NC dielectric materials and form second NC dielectric structure 107B.

Figure 13:
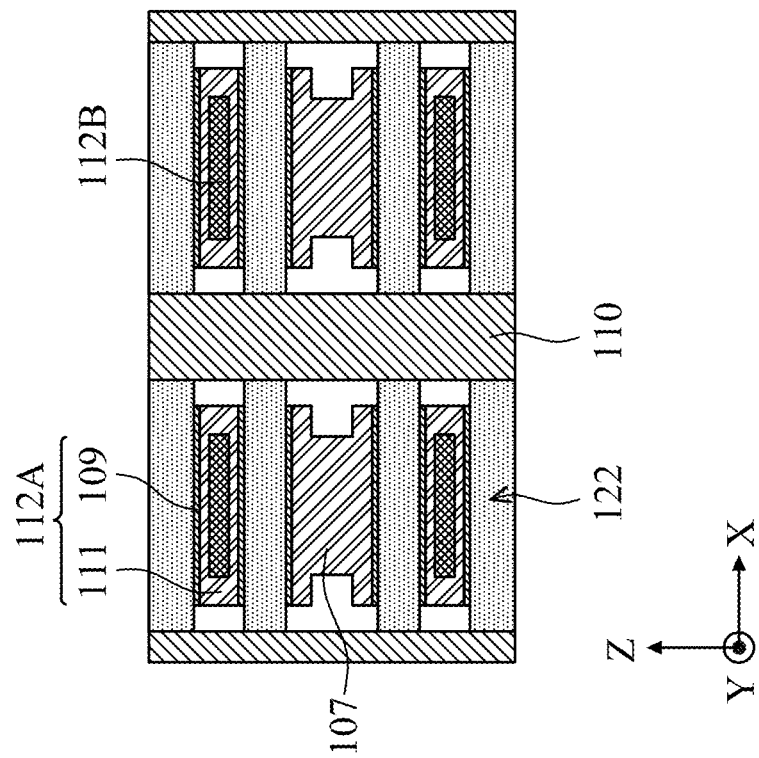

The fill of second NC dielectric structure 107B can be followed by formation of gate electrodes on NC HK layer 111, as shown in FIG. 13. In some embodiments, a layer of work function metal for gate work function layer 130, and a layer of conductive material for gate metal fill layer 132 on the layer of work function metal can be formed on NC HK layer 111. In some embodiments, as shown in FIGS. 1A-1E and 13, gate work function layer 130 and gate metal fill layer 132 can wrap around nanosheet/nanowire shaped semiconductor layers 122 as a result of the removal of semiconductor layers 420.

Figures 14A, 14B, 14C:
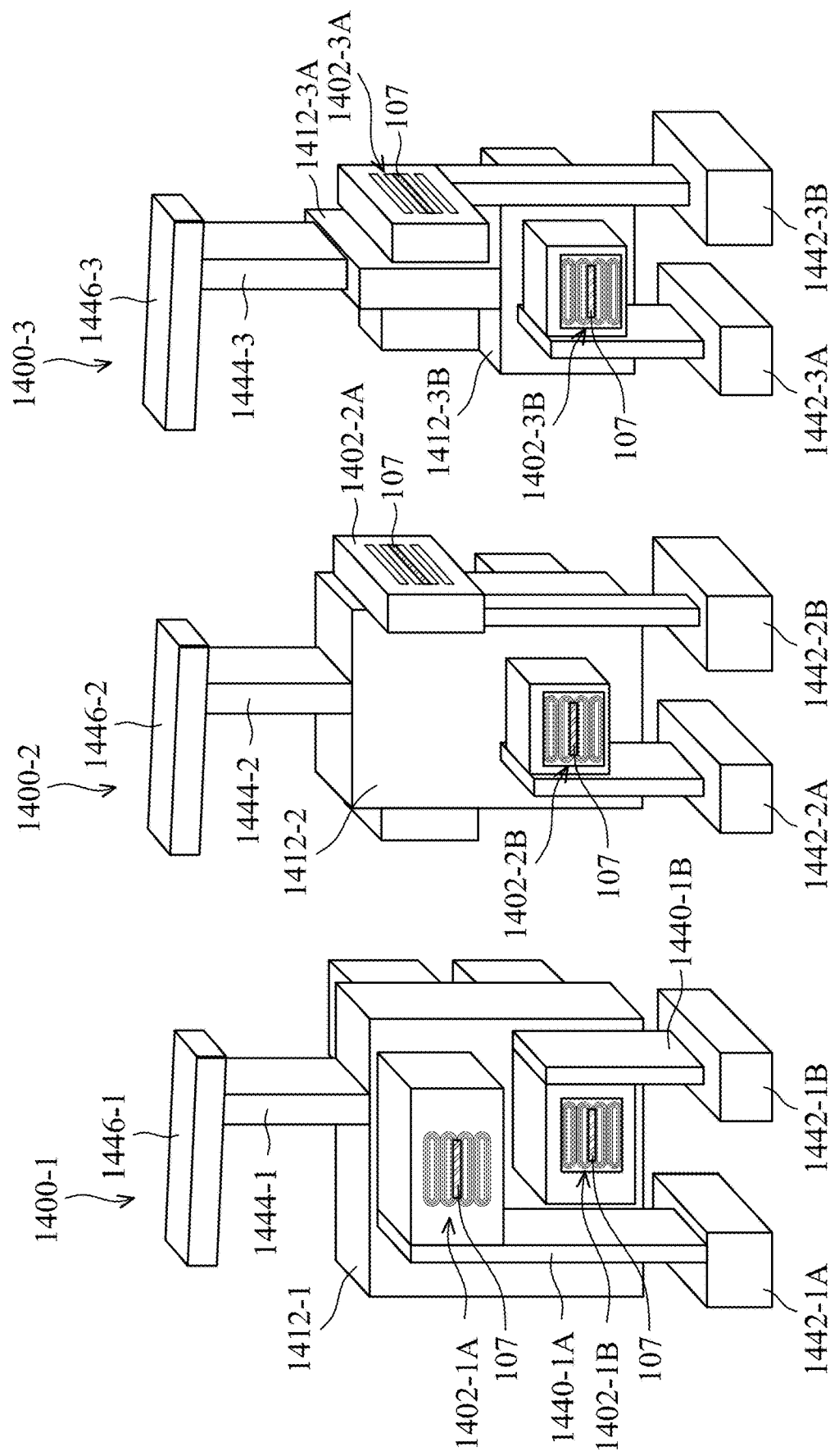
FIGS. 14A-14C illustrate isometric views of stacked semiconductor devices with NC layers, in accordance with some embodiments.

FIGS. 14A-14C illustrate isometric views of stacked semiconductor devices 1400-1, 1400-2, and 1400-3 (collectively referred to as "stacked semiconductor devices 1400") with NC layers, in accordance with some embodiments. As shown in FIGS. 14A-14C, finFETs 1402-1A, 1402-2A, and 1402-3A (collectively referred to as "finFETs 1402A") can be vertically stacked on top of finFETs 1402-1B, 1402-2B, and 1402-3B (collectively referred to as "finFETs 1402B") to reduce device area, reduce power consumption, and improve device performance. Gate structures 1412-1, 1412-2, 1412-3A, and 1412-3B (collectively referred to as "gate structures 1412") can be connected to gate contacts 1444-1, 1444-2, and 1444-3 (collectively referred to as "gate contacts 1444"), which can be further connected to interconnect structures 1446-1, 1446-2, and 1446-3 (collectively referred to as "interconnect structures 1446"). FinFETs 1402A can be connected to S/D contact structures 1440-1A, 1440-2A, and 1440-3A (collectively referred to as "S/D contact structures 1440A"), which can be further connected to buried power rails 1442-1A, 1442-2A, and 1442-3A (collectively referred to as "buried power rails 1442A"), such as a ground or Vss. FinFETs 1402B can be connected to S/D contact structures 1440-1B, 1440-2B, and 1440-3B (collectively referred to as "S/D contact structures 1440B"), which can be further connected to buried power rails 1442-1B, 1442-2B, and 1442-3B (collectively referred to as "buried power rails 1442B"), such as a power supply or Vdd. In some embodiments, each NC layer in each of semiconductor devices 1400-1, 1400-2, and 1400-3 can include NC dielectric materials described for NC layer 107 with reference to FIGS. 1A-1E. In some embodiments, NC layers in top and bottom devices of semiconductor devices 1400-1, 1400-2, or 1400-3 can include a same NC dielectric material. In some embodiments, NC layers in top and bottom devices of semiconductor devices 1400-1, 1400-2, or 1400-3 can include different NC dielectric materials. In some embodiments, each of top and bottom devices of stacked semiconductor devices 1400 can include two or more NC layers.

Referring to FIG. 14A, a fin structure of finFET 1402-1A can stack on top of a fin structure of finFET 1402-1B and extend along a direction parallel to the fin structure of finFET 1402-1B to reduce device area and provide independent control of each fin structure. Referring to FIG. 14B, a fin structure of finFET 1402-2A can extend along a direction perpendicular to a fin structure of finFET 1402-2B to reduce parasitic capacitance and improve device performance. Referring to FIG. 14C, in addition to fin structures perpendicular to each other, gate structure 1412-3A of finFET 1402-3A can extend along a direction perpendicular to gate structure 1412-3B of finFET 1402-3B to provide further compact metal interconnect to reduce parasitic resistance and capacitance. In some embodiments, each of finFETs 1402A and finFETs 1402B in FIGS. 14A-14C can include one or more NC layers to further reduce power consumption, reduce parasitic capacitance, and improve device performance.

Various embodiments in the present disclosure provide methods for forming a semiconductor device (e.g., semiconductor device 100 and stacked semiconductor devices 1400) with one or more NC layers 107. The example methods in the present disclosure can form semiconductor device 100 having first set of semiconductor layers 122-1 and 122-2, second set of semiconductor layers 122-3 and 122-4 over first set of semiconductor layers 122-1 and 122-2, and NC layer 107 between the first and second sets of semiconductor layers (as shown in FIG. 1C).

In some embodiments, the NC dielectric materials in NC layer 107 can include a dielectric material with ferroelectric properties, a dielectric material in orthorhombic phase (e.g., hafnium oxide ($HfO_2$) in orthorhombic phase), and/or a dielectric material (e.g., $HfO_2$) doped with one or more dopants, such as aluminum (Al), gadolinium (Gd), silicon (Si), yttrium (Y), zirconium (Zr), or a combination thereof. NC layer 107 can reduce subthreshold swing (SS) through internal voltage amplification mechanism and increase channel on-current to off-current (Ion/Ioff) ratio of semiconductor device 100. The reduction of SS in the semiconductor device 100 can achieve faster device operation along with lower switching energy, and can effectively scale down the supply voltage and significantly lower the power consumption in semiconductor device 100. In some embodiments, the power consumption of semiconductor device 100, and stacked semiconductor devices 1400 with NC layer 107 can be reduced by about 10% to about 40% compared with GAA finFET devices without NC layers.

In some embodiments, NC layer 107 between semiconductor layers 122 of semiconductor device 100 can reduce parasitic capacitances of semiconductor device 100. In some embodiments, NC layer 107 can be disposed between semiconductor layers 122-2 and 122-3 and can be in contact with gate dielectric layer 112A wrapped around each of semiconductor layers 122-2 and 122-3. In some embodiments, semiconductor device 100 can include two NC layers 107-1 and 107-2 between semiconductor layers 122, as shown in FIGS. 2A and 2B. In some embodiments, NC layer 107 can include first NC dielectric structure 107A and second NC dielectric structure 107B formed at different process steps and in contact with each other, as shown in FIGS. 4-13. In some embodiments, a first fin structure with a first NC layer can be stacked on a second fin structure with a second NC layer to further reduce parasitic capacitances and improve device performance of stacked semiconductor devices 1400. In some embodiments, device performance of semiconductor device 100 and stacked semiconductor devices 1400 with one or more NC layers can be improved by about 10% to about 40% compared with GAA finFET devices without NC layers.

In some embodiments, a method includes forming a fin structure including a fin base portion and a stacked fin portion on a substrate. The stacked fin portion includes a first semiconductor layer on the fin base portion, a second semiconductor layer above the first semiconductor layer, and a sacrificial semiconductor layer between the first and second semiconductor layers. The method further includes replacing the sacrificial semiconductor layer with a negative capacitance (NC) layer and forming gate structures around the NC layer, the first semiconductor layer, and the second semiconductor layer. The NC layer includes an NC dielectric material.

In some embodiments, a method includes forming a fin structure with a fin base portion and a stacked fin portion on a substrate. The stacked fin portion includes a first set of semiconductor layers on the fin base portion, a second set of semiconductor layers above the first set of semiconductor layers, and a sacrificial semiconductor layer between the first and second sets of semiconductor layers. The method further includes forming a first negative capacitance (NC) dielectric structure at a first region of the sacrificial semiconductor layer, forming an inner spacer structure adjacent to a first side of the first NC dielectric structure, and forming an epitaxial source/drain (S/D) region on the fin structure and adjacent to the inner spacer structure. The first NC dielectric structure includes a first NC dielectric material. The method further includes filling a second NC dielectric structure at a second region of the sacrificial semiconductor layer and forming gate structures around the first NC dielectric structure, the second NC dielectric structure, the first set of semiconductor layers, and the second set of semiconductor layers. The second region is adjacent to the first region of the sacrificial semiconductor layer, the second NC dielectric structure includes a second NC dielectric material, and the second NC dielectric structure is adjacent to a second side of the first NC dielectric structure.

In some embodiments, a semiconductor device includes a fin structure with a fin base portion and a stacked fin portion on a substrate. The stacked fin portion includes a first semiconductor layer on the fin base portion and a second semiconductor layer above the first semiconductor layer. The semiconductor device further includes a negative capacitance (NC) layer between the first and second semiconductor layers, first and second gate dielectric layers wrapped around the first and second semiconductor layers, respectively, and in contact with the NC layer, and gate electrodes wrapped around the first semiconductor layer, the second semiconductor layer, and the NC layer. The NC layer includes an NC dielectric material.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a stack of semiconductor layers on a substrate, wherein the stack of semiconductor layers comprises a first semiconductor layer on the substrate, a sacrificial semiconductor layer on the first semiconductor layer, and a second semiconductor layer on the sacrificial semiconductor layer;
   replacing the sacrificial semiconductor layer with a negative capacitance (NC) dielectric structure, wherein the NC dielectric structure comprises an NC dielectric material; and
   forming an inner spacer structure between end portions of the first and second semiconductor layers, wherein the inner spacer structure is in contact with the NC dielectric structure and extends into the NC dielectric structure.

2. The method of claim 1, wherein replacing the sacrificial semiconductor layer with the NC dielectric structure comprises:
removing an end region of the sacrificial semiconductor layer to form a recess between the first and second semiconductor layers;
depositing a layer of the NC dielectric material in the recess; and
removing a portion of the layer of the NC dielectric material.

3. The method of claim 2, wherein depositing the layer of the NC dielectric material in the recess comprises:
depositing a high-k dielectric material in the recess;
doping the high-k dielectric material with a dopant; and
treating the high-k dielectric material under a thermal condition.

4. The method of claim 2, wherein forming the inner spacer structure between end portions of the first and second semiconductor layers comprises:
depositing an inner spacer layer in the recess and on the layer of the NC dielectric material, wherein the inner spacer layer fills the recess and extends into the NC dielectric structure; and
laterally etching a portion of the inner spacer layer.

5. The method of claim 1, wherein replacing the sacrificial semiconductor layer with the NC dielectric structure comprises:
removing a middle region of the sacrificial semiconductor layer to form an opening between the first and second semiconductor layers; and
filling the opening with the NC dielectric material.

6. The method of claim 5, wherein filling the opening with the NC dielectric material comprises:
depositing a high-k dielectric material in the opening;
doping the high-k dielectric material with a dopant; and
treating the high-k dielectric material under a thermal condition.

7. The method of claim 1, further comprising forming a gate electrode around the NC dielectric structure, the first semiconductor layer, and the second semiconductor layer.

8. The method of claim 1, further comprising:
forming an additional stack of semiconductor layers on the stack of semiconductor layers, wherein:
the stack of semiconductor layers extends along a first direction;
the additional stack of semiconductor layers extends along a second direction; and
the additional stack of semiconductor layers comprises a third semiconductor layer on the stack of semiconductor layers, an additional sacrificial semiconductor layer on the third semiconductor layer, and a fourth semiconductor layer on the additional sacrificial semiconductor layer;
replacing the additional sacrificial semiconductor layer with an additional NC dielectric structure, wherein the additional NC dielectric structure comprises an additional NC dielectric material; and
forming an additional inner spacer structure between end portions of the third and fourth semiconductor layers, wherein the additional inner spacer structure is in contact with the additional NC dielectric structure and extends into the additional NC dielectric structure.

9. The method of claim 8, wherein the first direction is parallel to the second direction.

10. The method of claim 8, wherein the first direction is perpendicular to the second direction.

11. The method of claim 8, further comprising
forming a first gate electrode around the NC dielectric structure, the first semiconductor layer, and the second semiconductor layer along a third direction; and
forming a second gate electrode around the additional NC dielectric structure, the third semiconductor layer, and the fourth semiconductor layer along a fourth direction, wherein the third direction is parallel to the fourth direction.

12. The method of claim 8, further comprising
forming a first gate electrode around the NC dielectric structure, the first semiconductor layer, and the second semiconductor layer along a third direction; and
forming a second gate electrode around the additional NC dielectric structure, the third semiconductor layer, and the fourth semiconductor layer along a fourth direction, wherein the third direction is perpendicular to the fourth direction.

13. A method, comprising:
forming a stack of semiconductor layers on a substrate, wherein the stack of semiconductor layers comprises a first semiconductor layer on the substrate, a sacrificial semiconductor layer on the first semiconductor layer, and a second semiconductor layer on the sacrificial semiconductor layer;
replacing an end portion of the sacrificial semiconductor layer with a first negative capacitance (NC) dielectric structure, wherein the first NC dielectric structure comprises an NC dielectric material;
replacing a middle portion of the sacrificial semiconductor layer with a second negative capacitance (NC) dielectric structure, wherein the second NC dielectric structure comprises the NC dielectric material and is in contact with the first NC dielectric structure; and
forming an inner spacer structure between the first and second semiconductor layers, wherein the inner spacer structure is in direct contact with the first NC dielectric structure and the first and second semiconductor layers.

14. The method of claim 13, wherein replacing the end portion of the sacrificial semiconductor layer with the first NC dielectric structure comprises:
removing the end portion of the sacrificial semiconductor layer to form a recess between the first and second semiconductor layers;
depositing a layer of the NC dielectric material in the recess; and
removing a portion of the layer of the NC dielectric material.

15. The method of claim 14, wherein depositing the layer of the NC dielectric material in the recess comprises:
depositing a high-k dielectric material in the recess;
doping the high-k dielectric material with a dopant; and
treating the high-k dielectric material under a thermal condition.

16. The method of claim 13, wherein replacing the middle portion of the sacrificial semiconductor layer with the second NC dielectric structure comprises:
removing the middle portion of the sacrificial semiconductor layer to form an opening between the first and second semiconductor layers; and
filling the opening with the NC dielectric material.

17. A semiconductor device, comprising:
a stack of semiconductor layers on a substrate, wherein the stack of semiconductor layers comprises first and second semiconductor layers;

an NC dielectric structure between the first and second semiconductor layers, wherein the NC dielectric structure comprises an NC dielectric material; and an inner spacer structure between the first and second semiconductor layers, wherein the inner spacer structure is in direct contact with the NC dielectric structure and the first and second semiconductor layers.

18. The semiconductor device of claim 17, wherein the NC dielectric structure includes a top portion and a middle portion, and wherein a width of the top portion is greater than a width of the middle portion.

19. The semiconductor device of claim 18, wherein a ratio of the width of the middle portion to the width of the top portion ranges from about 0.5 to about 0.95.

20. The semiconductor device of claim 17, wherein the NC dielectric material comprises a high-k dielectric material having an orthorhombic phase and doped with one or more dopants.

* * * * *